United States Patent
Im et al.

(10) Patent No.: US 8,183,562 B2
(45) Date of Patent: May 22, 2012

(54) ORGANIC LIGHT EMITTING DISPLAY APPARATUS

(75) Inventors: Ki-Ju Im, Suwon-si (KR); Yong-Sung Park, Suwon-si (KR); Yong-Woo Park, Suwon-si (KR); Moo-Jin Kim, Suwon-si (KR); Han-Hee Yoon, Suwon-si (KR); Kwang-Hae Kim, Suwon-si (KR); Sung-Won Doh, Suwon-si (KR); Kyoung-Bo Kim, Suwon-si (KR); Gun-Shik Kim, Suwon-si (KR); Jun-Sik Oh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 254 days.

(21) Appl. No.: 12/636,303

(22) Filed: Dec. 11, 2009

(65) Prior Publication Data

US 2010/0148163 A1 Jun. 17, 2010

(30) Foreign Application Priority Data

Dec. 11, 2008 (KR) .................. 10-2008-0125962

(51) Int. Cl.
*H01L 51/50* (2006.01)
(52) U.S. Cl. ............... 257/40; 257/59; 257/72; 257/88; 257/E51.022
(58) Field of Classification Search .............. 257/40, 257/59, 72, 88, E51.022
See application file for complete search history.

(56) References Cited

U.S. PATENT DOCUMENTS

| | | | |
|---|---|---|---|
| 2007/0170423 A1* | 7/2007 | Choi et al. | 257/40 |
| 2007/0188085 A1* | 8/2007 | Young | 313/506 |
| 2007/0205420 A1* | 9/2007 | Ponjee et al. | 257/80 |
| 2007/0257254 A1* | 11/2007 | Yang et al. | 257/40 |
| 2007/0285411 A1* | 12/2007 | Yang et al. | 345/207 |
| 2007/0285942 A1* | 12/2007 | Yang et al. | 362/608 |

FOREIGN PATENT DOCUMENTS

| | | |
|---|---|---|
| KR | 10-2005-0119558 | 12/2005 |
| KR | 10-0762682 | 9/2007 |
| KR | 10-0776498 B1 | 11/2007 |

OTHER PUBLICATIONS

KIPO Office action dated Jan. 29, 2010, for priority Korean application 10-2008-0125962, noting listed reference in this IDS.

KIPO Registration Determination Certificate dated May 31, 2010, for priority Korean Patent application 10-2008-0125962, noting listed references in this IDS, as well as KR 10-0762682 previously filed in an IDS dated Apr. 15, 2010.

* cited by examiner

*Primary Examiner* — Luan C Thai
(74) *Attorney, Agent, or Firm* — Christie, Parker & Hale, LLP

(57) ABSTRACT

An organic light emitting display apparatus includes an organic light emitting diode, a photo sensor, and a light blocking portion. The light blocking portion is at at least a side of the photo sensor so that light emitted from the organic light emitting diode is not directly incident on the photo sensor.

13 Claims, 3 Drawing Sheets

ORGANIC LIGHT EMITTING DISPLAY APPARATUS

CROSS-REFERENCE TO RELATED PATENT APPLICATION

This application claims priority to and the benefit of Korean Patent Application No. 10-2008-0125962, filed on Dec. 11, 2008, in the Korean Intellectual Property Office, the entire content of which is incorporated herein by reference.

BACKGROUND OF THE INVENTION

1. Field of the Invention

The present invention relates to an organic light emitting display apparatus, and more particularly, to an organic light emitting display apparatus having a touch panel function and a photo sensor with increased light sensitivity.

2. Description of the Related Art

Developments in display technology have led to the replacement of conventional display devices with portable, thin flat panel display devices. Among the flat panel display devices, electroluminescent display devices, which are self-emissive display devices, have wide viewing angle, high contrast ratio, and high response speed, and thus have been considered as the next-generation display devices. In addition, an organic light-emitting display device having a light emitting layer formed of an organic material has improved properties in terms of brightness, driving voltage, and response speed in comparison to an inorganic light emitting display device, and can realize multiple colors.

Researches are in progress to develop organic light emitting display devices with touch panel functions. In one approach, a display screen having a touch panel function is mounted on an organic light emitting display apparatus so that a command can be input by touching the display screen with a finger or a pen device. The touch panel display screen used in this case includes a photo sensor.

However, in an organic light emitting display apparatus having a conventional touch panel function, light cannot be sensed properly when there is an inadequate amount of light due to dark surroundings. To address this problem, a method of sensing light using internal light emitted from an organic light emitting diode has been developed. In order to realize a touch panel function, the light emitted from the organic light emitting diode needs to be emitted to the outside of a panel and reflected by the finger of the user, and be incident on the photo sensor. However, some of the light rays emitted from the organic light emitting diode are not emitted to the outside of the panel and reflected by the finger of the user, but are directly incident on the photo sensor. Accordingly, the light sensitivity of the photo sensor is not totally reliable. So even when a user does not touch the display screen, internal light can still be sensed and malfunctions can occur, thereby increasing product defects and user's inconvenience.

SUMMARY OF THE INVENTION

An organic light emitting display apparatus according to an embodiment of the present invention includes a photo sensor with increased light sensitivity by preventing light from an organic light emitting diode from being directly incident on the photo sensor, wherein the organic light emitting display apparatus includes a light blocking portion on a path of light emitted from the organic light emitting diode toward the photo sensor.

Exemplary embodiments according to the present invention provide an organic light emitting display apparatus including an organic light emitting diode, a photo sensor, and a light blocking portion, wherein the light blocking portion is at at least a side of the photo sensor so that light emitted from the organic light emitting diode is not directly incident on the photo sensor.

In one embodiment, the light blocking portion is on a path through which the light emitted from the organic light emitting diode would be directly incident on the photo sensor.

The organic light emitting display may further include a plurality of organic light emitting diodes and a plurality of photo sensors that are alternately arranged, and a plurality of light blocking portions, wherein one of the light blocking portions is between a respective one of the light emitting diodes and a respective one of the photo sensors.

According to one embodiment, an organic light emitting display apparatus includes at least one thin film transistor on a substrate. In an exemplary embodiment, the organic light emitting display apparatus includes a semiconductor active layer, a gate electrode that is insulated from the semiconductor active layer, and source and drain electrodes each contacting the semiconductor active layer; at least one photo sensor, each photo sensor at at least a side of a respective one of the at least one thin film transistor and detecting incident light thereon. In one embodiment, a plurality of pixel electrodes are provided on the at least one thin film transistor and a plurality of pixel definition layers. Each pixel definition layer is between the pixel electrodes. In another embodiment, a plurality of organic layers are provided on the pixel electrodes and the pixel definition layers, and a plurality of counter electrodes are provided on the organic layers and the pixel definition layers. In certain embodiments, a plurality of holes are provided in the pixel definition layers to expose respective plurality of organic layers.

In one embodiment, the counter electrodes are arranged along the plurality of holes of the pixel definition layers such that when light rays emit from the organic layers they would reflect on the counter electrodes. In another embodiment, each of the plurality of holes is arranged on a path through which light emitted from a respective one of the organic layers would be directly incident on the at least one photo sensor. In other words, each of the counter electrodes along the holes prevents light emitted from a respective one of the organic layers from being directly incident on the photo sensor.

In certain embodiments, the organic layers and the photo sensors are alternately arranged, and each of the plurality of holes is between a respective one of the organic layers and a respective one of the at least one photo sensor. In one embodiment, the organic layers surround the photo sensors, and the holes surround the photo sensors and are between the photo sensors and the organic layers.

In another embodiment, an organic light emitting display apparatus is provided. The organic light emitting display apparatus includes an organic light emitting diode, a photo sensor, and a light blocking portion, wherein the light blocking portion is at at least a side of the photo sensor so as to block light emitted from the organic light emitting diode from being directly incident on the photo sensor. The light blocking portion is on a path through which the light emitted from the organic light emitting diode would be directly incident on the photo sensor.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

Figure 1:
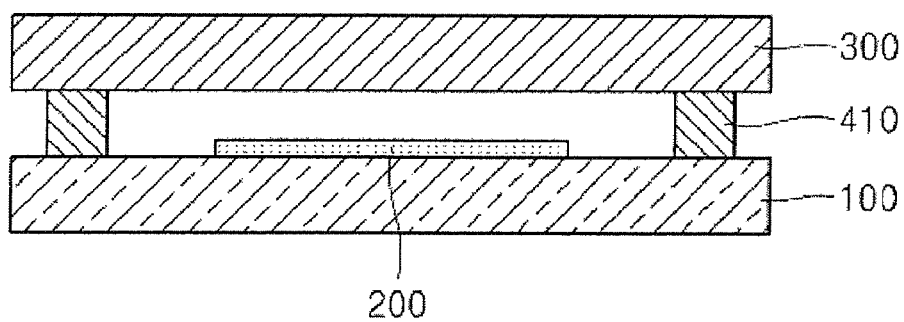
FIG. 1 is a schematic cross-sectional view illustrating a portion of an organic light emitting display apparatus according to an embodiment of the present invention.
Figure 2:
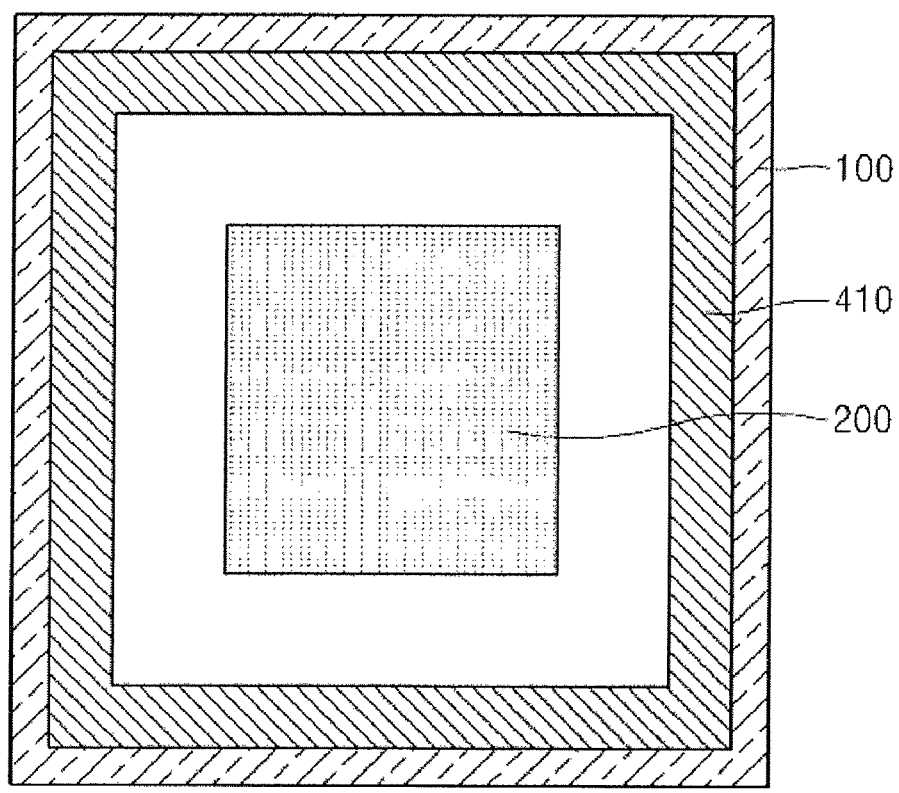
FIG. 2 is a schematic plan view illustrating the organic light emitting display apparatus of FIG. 1.

FIG. 1 is a cross-sectional view illustrating a portion of an organic light emitting display apparatus according to an embodiment of the present invention, and FIG. 2 is a plan view illustrating the organic light emitting display apparatus of FIG. 1. In FIG. 2, an encapsulation substrate 300 illustrated in FIG. 1 is not shown.

Referring to FIGS. 1 and 2, a display unit 200 including an organic light emitting diode is placed on a substrate 100.

The substrate 100 may be formed of a transparent glass containing $SiO_2$ as a main component, but is not limited thereto, and thus may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), cellulose acetate propionate (CAP), and combinations thereof.

In a bottom emission type organic light-emitting display apparatus in which an image is formed (i.e., displayed) toward the substrate 100, the substrate 100 is preferably formed of a transparent material. However, in a top emission type organic light-emitting display apparatus in which an image is formed (i.e., displayed) away from the substrate 100, the substrate 100 may not necessarily be a transparent material, and, in this case, the substrate 100 may be formed of a metal. When the substrate 100 is formed of a metal, the substrate 100 may include at least one material selected from the group consisting of carbon (C), iron (Fe), chromium (Cr), manganese (Mg), nickel (Ni), titanium (Ti), molybdenum (Mo), stainless steel (SUS), Invar alloys, Inconel alloys, Kovar alloys, and combinations thereof. However, the present invention is not limited to the above examples. Thus the substrate 100 may also be formed of a metal foil.

In one embodiment, a buffer layer of a bottom emission type organic light-emitting display apparatus may be formed on a top surface of the substrate 100 to planarize the substrate 100 and to prevent penetration of impurities into the bottom emission type organic light-emitting display apparatus.

The substrate 100 including the display unit 200 is attached to an encapsulation substrate 300 that is disposed above the display unit 200. The encapsulation substrate 300 may be formed not only of a glass material but also of various plastic materials such as acryl, or a metal.

The substrate 100 and the encapsulation substrate 300 are attached to each other using a sealant 410. The sealant 410 may be a sealing glass frit, as generally used in the art. Alternatively, the sealant 410 may be an organic sealant, an inorganic sealant, an organic/inorganic hybrid sealant, or a mixture thereof.

Figure 3:
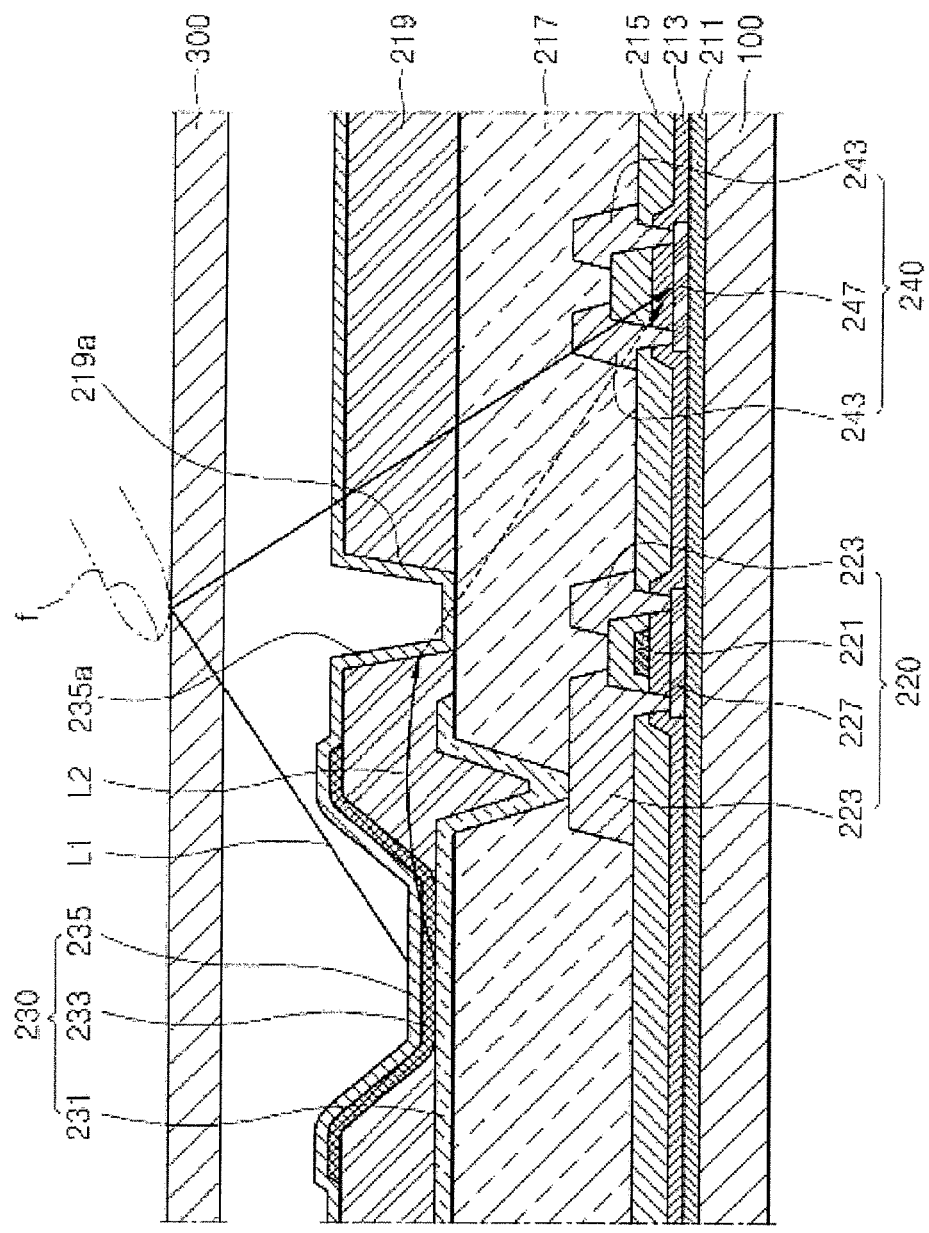
FIG. 3 is a cross-sectional view illustrating a portion of the organic light display emitting apparatus of FIG. 1.

FIG. 3 is a cross-sectional view illustrating a portion of the organic light emitting display apparatus of FIG. 1, showing the display unit 200 in detail.

The display unit 200 will be briefly described hereinafter.

The display unit 200 is formed on the substrate 100, and includes an organic light emitting diode 230 and a photo sensor 240 formed on the substrate 100. Various modifications such as a thin film transistor 220, which controls light emission of the organic light emitting diode 230 and which is formed on the substrate 100 are possible, as illustrated in FIG. 3. Hereinafter, the display unit 200 having the structure illustrated in FIG. 3 will be described.

Figure 4:
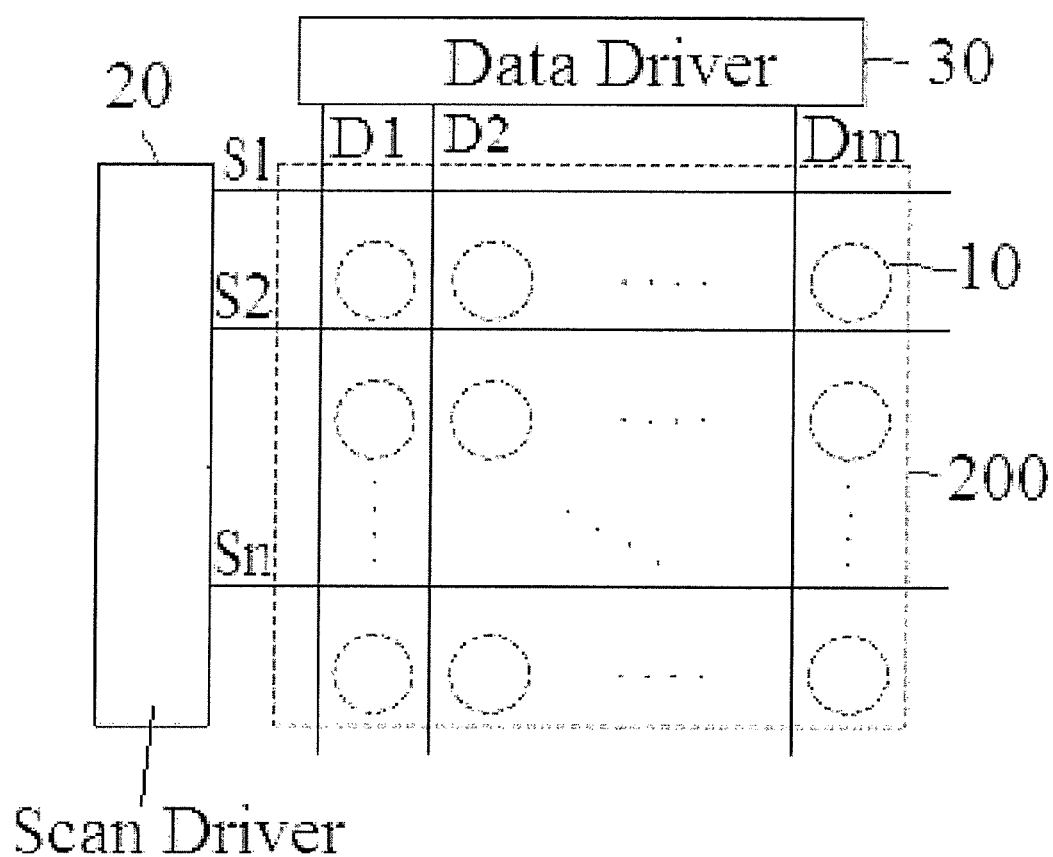
FIG. 4 is a schematic diagram of an organic light emitting display device including the organic light emitting display apparatus of FIGS. 1-3.

Referring to FIGS. 3 and 4, a plurality of thin film transistors 220 and a plurality of photo sensors 240 are formed on the substrate 100. Also, an organic light emitting diode 230 is formed above the thin film transistors 220 and the photo sensors 240. The organic light emitting diodes 230 includes a pixel electrode 231 that is electrically connected to the thin film transistor 220, a counter electrode 235 disposed over the entire substrate 100, and an intermediate layer 233 that is formed between the pixel electrode 231 and the counter electrode 235 and includes at least a light emitting layer.

The thin film transistors 220, each including a gate electrode 221, source and drain electrodes 223, a semiconductor layer 227, a gate insulating layer 213, and an interlayer insulating layer 215, are formed on the substrate 100. The present embodiment is not limited to the thin film transistors 220 of FIG. 3, and thus other various thin film transistors such as an organic thin film transistor including a semiconductor layer 227 formed of an organic material or a silicon thin film transistor formed of silicon may also be used. A buffer layer 211 formed of a silicon oxide or a silicon nitride may be further formed between the thin film transistors 220 and the substrate 100 according to necessity.

Photo sensors 240 are formed on the substrate 100. The photo sensors 240 may have various structures; for example, the photo sensor 240 as illustrated in FIG. 3 has a structure similar to a thin film transistor. The photo sensor 240 includes two metal layers 243 and a semiconductor layer 247, and when light is incident thereon, an electrical signal is generated between the two metal layers 243 via the semiconductor layer 247.

A passivation layer or a planarization layer 217 is formed to cover the thin film transistors 220 and the photo sensors 240, and a pixel definition layer (PDL) 219 defining regions of the pixels is formed on the passivation layer or planarization layer 217, and the organic light emitting diode 230 is formed on the PDL 219. The organic light emitting diode 230 includes the pixel electrode 231 and the counter electrode 235 facing each other, and the intermediate layer 233 interposed between the pixel electrode 231 and the counter electrode 235 and formed of an organic material and interposed therebetween. The intermediate layer 233, including at least a light emitting layer, may also include a plurality of layers as will be described later.

The pixel electrode 231 functions as an anode and the counter electrode 235 functions as a cathode electrode, or vice versa.

The pixel electrode 231 may be formed as a transparent electrode or a reflective electrode. When formed as a transparent electrode, the pixel electrode 231 may be formed of indium tin oxide (ITO), indium zinc oxide (IZO), ZnO, or $In_2O_3$. When formed as a reflective electrode, the pixel electrode 231 may include a reflection layer formed of Ag, Mg, Al, Pt, Pd, Au, Ni, Nd, Ir, Cr, or a compound thereof, and a layer formed of ITO, IZO, ZnO, or $In_2O_3$, formed on the reflection layer. However, the pixel electrode 231 is not limited thereto, and may be formed of various other materials. The structure of the pixel electrode 231 may also be a single layer or a multi-layer.

The counter electrode 235 may also be formed as a transparent electrode or a reflective electrode. When formed as a transparent electrode, the counter electrode 235 may include a layer in which Li, Ca, LiF/Ca, LiF/Al, Al, Mg, or a compound thereof is deposited toward the intermediate layer 233 between the pixel electrode 231 and the counter electrode 235, and may also include a bus electrode line or an auxiliary electrode formed of ITO, IZO, ZnO, or $In_2O_3$. When formed of a reflective electrode, the counter electrode 235 may be formed by depositing Li, Ca, LiF/Ca, LiF/Al, Al, Mg or a compound thereof. However, the structure and materials of the counter electrode 235 are not limited thereto, and may be formed in other manners.

In one embodiment, the PDL 219 is formed to cover an edge (i.e., peripheral portion) of the pixel electrode 231, and has a predetermined thickness. In addition to defining a light emitting region, the PDL 219 increases a distance (or gap) between the edge of the pixel electrode 231 and the counter electrode 235 to correspond to the thickness of the PDL 219, to prevent a concentration of electric field on the edge portion of the pixel electrode 231, thereby preventing a short circuit between the pixel electrode 231 and the counter electrode 235. In addition, the PDL 219 prevents light emitted from the intermediate layer 233 from being directly incident on the photo sensor 240.

Various kinds of the intermediate layer 233 including at least a light emitting layer may be formed between the pixel electrode 231 and the counter electrode 235. In one embodiment, the intermediate layer 233 is formed of a small molecule organic material or a polymer organic material.

When formed of a small molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked. Nonlimiting examples of suitable organic materials include copper phthalocyanine (CuPc), N,N'-Di(naphthalene-1-yl)-N,N'-diphenyl-benzidine (NPB), and tris-8-hydroxyquinoline aluminum (Alq3). The small molecule organic materials may be formed using a vacuum deposition method using masks.

When formed of a polymer organic material, the intermediate layer 233 may have a structure formed of an HTL and an EML. The HTL may be formed of poly(3,4-ethylenedioxythiophene) (PEDOT), and the EML may be formed of polyphenylenevinylene (PPV) and polyfluorene.

The organic light emitting diode 230 is electrically connected to the thin film transistor 220 that is disposed therebelow. When the planarization layer 217 covering the thin film transistor 220 is formed, the organic light emitting diode 230 is disposed on the planarization layer 217, and the pixel electrode 231 of the organic light emitting diode 230 is electrically connected to the thin film transistor 220 via a contact hole formed in the planarization layer 217.

The organic light emitting diode 230 formed on the substrate 100 is sealed by the encapsulation substrate 300. The encapsulation substrate 300 may be formed of various materials such as glass or plastic, as described above.

Thus, in the above-described organic light emitting display apparatus according to an embodiment of the present invention, a light blocking portion is formed so that light emitted from the intermediate layer 233 is not directly incident on the photo sensor 240.

In an organic light emitting display apparatus with a conventional touch panel function, it is difficult to efficiently or properly perform light sensing when there is an inadequate amount of light due to the dark surroundings. To address this problem, methods of sensing light using internal light that is emitted from an organic light emitting diode have been developed. However, some of light rays emitted from the organic light emitting diode are not only emitted to the outside of the organic light emitting display apparatus and reflected by a finger of the user and incident again on the photo sensor, but are also directly incident on the photo sensor. Consequently, light sensing function of the photo sensor is not totally accurate. Thus, even when a user does not touch the display screen, internal light may be sensed and malfunctions can occur, thereby increasing product defects and users' inconvenience.

In order to address this problem, in the organic light emitting display apparatus according to the current embodiment of the present invention, a hole 219a is formed in the PDL 219 and the counter electrode 235 is formed along the hole 219a so as to function as a light blocking portion so that light emitted from the intermediate layer 233 is not directly incident on the photo sensor 240.

The semiconductor layer 247 is formed on the substrate 100. The gate insulating layer 213 and the interlayer insulating layer 215 are sequentially stacked on the semiconductor layer 247, and a contact hole is formed in the gate insulating layer 213 and the interlayer insulating layer 215, and the metal layers 243 are formed in the contact hole. The passivation layer or planarization layer 217 is disposed to cover the metal layers 243. In turn, the PDL 219 defining regions of each pixel is formed on the passivation layer or planarization layer 217, and the organic light emitting diode 230 is disposed on the PDL 219.

The hole 219a is formed in the PDL 219. That is, there is a hole in a portion of the PDL 219 on a path through which light emitted from the intermediate layer 233 is directly incident on the photo sensor 240. The pixel electrode 231, the intermediate layer 233, and the counter electrode 235 are sequentially formed on the PDL 219. The counter electrode 235 is formed over the PDL 219 and covers the PDL 219 entirely, and thus the counter electrode 235 is also formed along the hole 219a in the PDL 219. The counter electrode 235 in the portion of the hole 219a of the PDL 219 is curved, and a curved portion of the counter electrode 235 functions as a light blocking portion 235a.

The hole 219a and the light blocking portion 235a in the hole 219a are formed on the path of light that is directly incident from the intermediate layer 233 on the photo sensor 240. In other words, the hole 219a and the light blocking portion 235a in the hole 219a are formed at least at one side of the photo sensor 240. Also, the hole 219a and the light blocking portion 235a in the hole 219a are formed between the thin film transistors 220 and the photo sensors 240.

In FIG. 3, reference numeral L1 denotes a normal path of light, where light sensing takes place based on internal light emitted from the organic light emitting diode 230. That is, some of the light emitted from the intermediate layer 233 is emitted to the outside of the display unit 200 and is reflected by the finger f of the user and is incident on the photo sensor 240, thereby causing the photo sensor 240 to sense light. Reference numeral L2 denotes a non-typical path of internal light rays emitted from the organic light emitting diode 230. That is, some of the light rays emitted from the intermediate layer 233 are directly incident on the photo sensor 240. In order to address such problem, a light blocking portion is mounted on a path of light that would otherwise be directly incident on the photo sensor 240 from the intermediate layer 233, thereby preventing light emitted from the intermediate layer 233 from being directly incident on the photo sensor 240.

FIG. 4 is a schematic diagram of an organic light emitting display device including the organic light emitting display apparatus of FIGS. 1-3 or any other suitable organic light emitting display apparatus.

As shown, the organic light emitting display device according to one exemplary embodiment of the present invention includes an organic light emitting display panel 200, a scan driver 20, and a data driver 30.

The organic light emitting display panel 200 includes a plurality of data lines D1 to Dm arranged in columns, a plurality of scan lines S1 to Sn arranged in rows, and a plurality of pixel circuits 10. The data lines D1 to Dm transmit a data voltage representing an image signal to the pixel circuits 10. The scan lines S1 to Sn transmit a select signal for selecting a pixel circuit to the pixel circuits 10. Each pixel circuit 10 is formed in a pixel area defined by two adjacent data lines D1 to Dm and two adjacent scan lines S1 to Sn. Each of the pixel circuits 10 includes an organic light emitting diode 230, a photo sensor 240, and a light blocking portion 235a.

The scan driver 20 sequentially applies the select signal to the scan lines S1 to Sn, and the data driver 30 applies the data voltage representing an image signal to the data lines D1 to Dm.

The scan driver 20 and/or the data driver 30 can be coupled to the display panel 200, or mounted in the form of a chip on a tape carrier package (TCP) that is coupled to the display panel 200 by soldering. The scan driver 20 and/or the data driver 30 can also be mounted in the form of a chip on a flexible printed circuit (FPC) or a film coupled to the display panel by soldering. Alternatively, the scan driver 20 and/or the data driver 30 can be mounted directly on the glass substrate of the display panel, or replaced by the driving circuit comprised of the same layers as scan and data lines and thin film transistors on the glass substrate.

According to an embodiment of the present invention, the light emitted from the organic light emitting diode 230 is prevented from being directly incident on the photo sensor 240, thereby increasing the light sensitivity and decreasing malfunction of products and product defects. Accordingly, convenience of the user is increased.

While the present invention has been particularly shown and described with reference to exemplary embodiments thereof, it will be understood by those of ordinary skill in the art that various changes in form and details may be made therein without departing from the spirit and scope of the present invention, as defined by the following claims and their equivalents.

What is claimed is:

1. An organic light emitting display apparatus comprising:
an organic light emitting diode comprising a first electrode, an intermediate layer, and a second electrode;
a photo sensor; and
a light blocking portion integrally formed with the first electrode,
wherein the light blocking portion is at least a side of the photo sensor so that light emitted from the organic light emitting diode is not directly incident on the photo sensor.

2. The organic light emitting display apparatus of claim 1, wherein the light blocking portion is on a path through which the light emitted from the organic light emitting diode would be directly incident on the photo sensor.

3. The organic light emitting display apparatus of claim 1, further comprising a plurality of organic light emitting diodes and a plurality of photo sensors that are alternately arranged, and a plurality of light blocking portions, wherein one of the light blocking portions is between a respective one of the organic light emitting diodes and a respective one of the photo sensors.

4. An organic light emitting display apparatus comprising:
at least one thin film transistor on a substrate and comprising a semiconductor active layer, a gate electrode that is insulated from the semiconductor active layer, and source and drain electrodes each contacting the semiconductor active layer;
at least one photo sensor, each photo sensor at least a side of a respective one of the at least one thin film transistor and for detecting incident light thereon;
a plurality of pixel electrodes on the at least one thin film transistor and
a plurality of pixel definition layers, each pixel definition layer between respective ones of the pixel electrodes;
a plurality of organic layers on the pixel electrodes and the pixel definition layers; and
a plurality of counter electrodes on the organic layers and the pixel definition layers,
wherein a plurality of holes are in the pixel definition layers to expose respective said plurality of organic layers.

5. The organic light emitting display apparatus of claim 4, wherein the counter electrodes are along the plurality of holes of the pixel definition layers.

6. The organic light emitting display apparatus of claim 5, wherein some of light rays emitted from the organic layers are reflected on the counter electrodes along the plurality of holes of the pixel definition layers.

7. The organic light emitting display apparatus of claim 4, wherein each of the plurality of holes is arranged on a path through which light emitted from a respective one of the organic layers would be directly incident on the at least one photo sensor.

8. The organic light emitting display apparatus of claim 7, wherein each of the counter electrodes along the holes prevents light emitted from a respective one of the organic layers from being directly incident on the photo sensor.

9. The organic light emitting display apparatus of claim 4, wherein the organic layers and the at least one photo sensor are alternately arranged, and each of the plurality of holes is between a respective one of the organic layers and a respective one of the at least one photo sensor.

10. The organic light emitting display apparatus of claim 4, wherein the at least one photo sensor comprises a plurality of photo sensors, and the plurality of organic layers surround the photo sensors, and the plurality of holes surround the photo sensors and are between the photo sensors and the organic layers.

11. An organic light emitting display apparatus comprising:
an organic light emitting diode comprising a first electrode, an intermediate layer, and a second electrode;
a photo sensor; and
a light blocking portion integrally formed with the first electrode,
wherein the light blocking portion is at least a side of the photo sensor so as to block light emitted from the organic light emitting diode from being directly incident on the photo sensor.

12. The organic light emitting display apparatus of claim 11, wherein the light blocking portion is on a path through which the light emitted from the organic light emitting diode would be directly incident on the photo sensor.

13. The organic light emitting display apparatus of claim 11, further comprising a plurality of organic light emitting diodes and a plurality of photo sensors that are alternately arranged, and a plurality of light blocking portions, wherein one of the light blocking portions is between a respective one of the light emitting diodes and a respective one of the photo sensors.

* * * * *

UNITED STATES PATENT AND TRADEMARK OFFICE
CERTIFICATE OF CORRECTION

PATENT NO. : 8,183,562 B2  Page 1 of 1
APPLICATION NO. : 12/636303
DATED : May 22, 2012
INVENTOR(S) : Ki-Ju Im et al.

It is certified that error appears in the above-identified patent and that said Letters Patent is hereby corrected as shown below:

In the Claims

| | |
|---|---|
| Column 7, Claim 1, line 60 | After "at" Insert -- at -- |
| Column 8, Claim 4, line 14 | After "sensor" Insert -- at -- |
| Column 8, Claim 11, line 61 | After "is" Insert -- at -- |

Signed and Sealed this
Eighth Day of October, 2013

Teresa Stanek Rea
*Deputy Director of the United States Patent and Trademark Office*